(12) United States Patent  (10) Patent No.: US 9,245,898 B2
Fujikura et al.  (45) Date of Patent: Jan. 26, 2016

(54) NAND FLASH MEMORY INTEGRATED CIRCUITS AND PROCESSES WITH CONTROLLED GATE HEIGHT

(71) Applicant: SanDisk Technologies Inc., Plano, TX (US)

(72) Inventors: Eiichi Fujikura, Mie (JP); Susumu Okazaki, Mie (JP); Takuya Futase, Mie (JP); Fumiaki Toyama, San Jose, CA (US); Hiroaki Koketsu, Kanagawa (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/320,103

(22) Filed: Jun. 30, 2014

(65) Prior Publication Data

US 2015/0380420 A1   Dec. 31, 2015

(51) Int. Cl.
*H01L 21/76*   (2006.01)
*H01L 27/115*   (2006.01)
*H01L 21/28*   (2006.01)
*H01L 21/3205*   (2006.01)
*H01L 21/3213*   (2006.01)

(52) U.S. Cl.
CPC .... *H01L 27/11524* (2013.01); *H01L 21/28061* (2013.01); *H01L 21/28273* (2013.01); *H01L 21/32055* (2013.01); *H01L 21/32133* (2013.01); *H01L 27/11529* (2013.01); *H01L 27/11541* (2013.01)

(58) Field of Classification Search
CPC ............... H01L 27/11526; H01L 27/11529; H01L 27/11531; H01L 27/11536; H01L 27/11539; H01L 27/11541; H01L 27/11543; H01L 27/11551; H01L 27/11524; H01L 21/28273; H01L 21/28061; H01L 21/32055; H01L 21/32133
USPC .................................. 438/424, 587; 257/211
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,887,145 A | 3/1999 | Harari et al. | |
| 6,046,935 A | 4/2000 | Takeuchi et al. | |
| 7,683,404 B2* | 3/2010 | Jang | H01L 21/8221 257/202 |
| 7,951,669 B2 | 5/2011 | Harari et al. | |
| 2001/0045590 A1* | 11/2001 | Kobayashi | H01L 27/105 257/298 |
| 2004/0238880 A1* | 12/2004 | Nagasaka | G11C 16/30 257/316 |
| 2005/0082602 A1 | 4/2005 | Okajima | |
| 2006/0030109 A1 | 2/2006 | Ranade et al. | |
| 2006/0071266 A1* | 4/2006 | Endo | H01L 27/105 257/321 |
| 2007/0012979 A1 | 1/2007 | Song et al. | |
| 2007/0057316 A1* | 3/2007 | Yaegashi | H01L 27/115 257/321 |
| 2008/0173929 A1* | 7/2008 | Morikado | H01L 27/105 257/316 |
| 2008/0315280 A1* | 12/2008 | Watanabe | H01L 27/115 257/315 |
| 2009/0050951 A1* | 2/2009 | Inaba | H01L 27/105 257/316 |
| 2010/0072560 A1* | 3/2010 | Lee | H01L 21/26586 257/393 |
| 2010/0314679 A1 | 12/2010 | Lee | |
| 2010/0330789 A1* | 12/2010 | Hyun | H01L 27/105 438/585 |
| 2013/0023099 A1* | 1/2013 | Noda | H01L 21/823425 438/287 |
| 2014/0015030 A1* | 1/2014 | Han | H01L 29/788 257/316 |
| 2014/0054669 A1 | 2/2014 | Sel et al. | |

\* cited by examiner

*Primary Examiner* — Vongsavanh Sengdara
(74) *Attorney, Agent, or Firm* — Davis Wright Tremaine LLP

(57) ABSTRACT

A NAND flash memory integrated circuit chip includes a cell area and a peripheral area with structures of different heights, with higher structures in the peripheral area to provide low resistance and lower structures in the memory array so that the risk of word line collapse is maintained at acceptable levels.

10 Claims, 9 Drawing Sheets

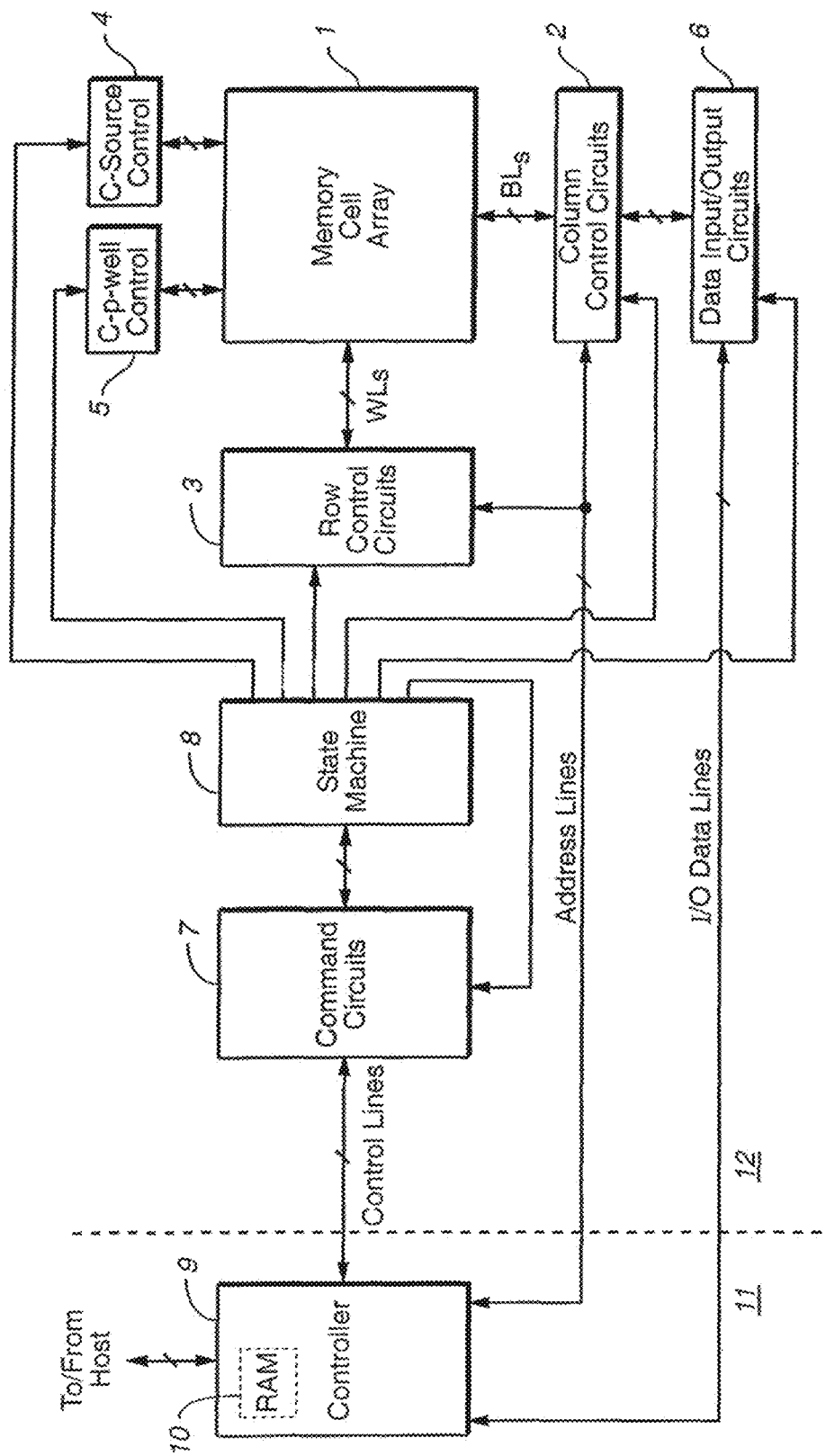
FIG._1
(Prior Art)

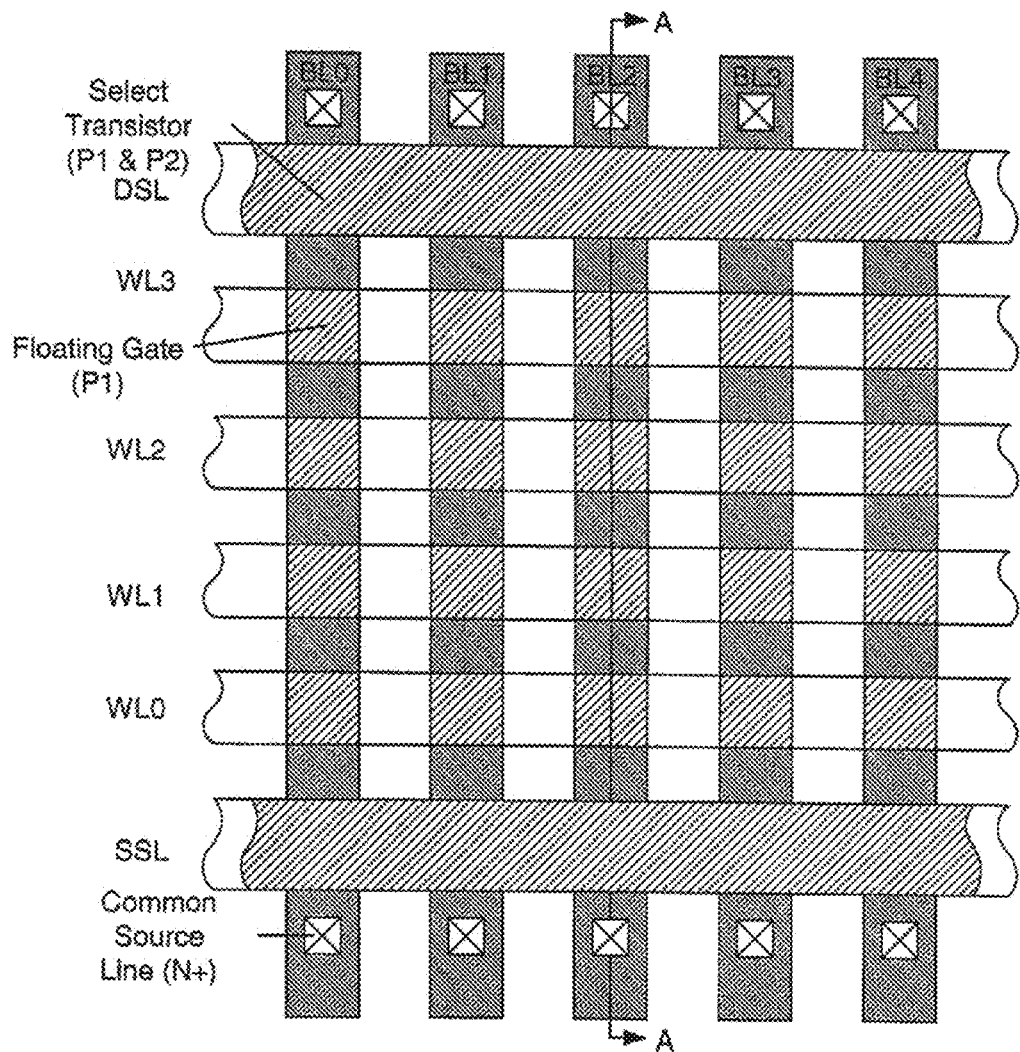
FIG._ 2A (PRIOR ART)

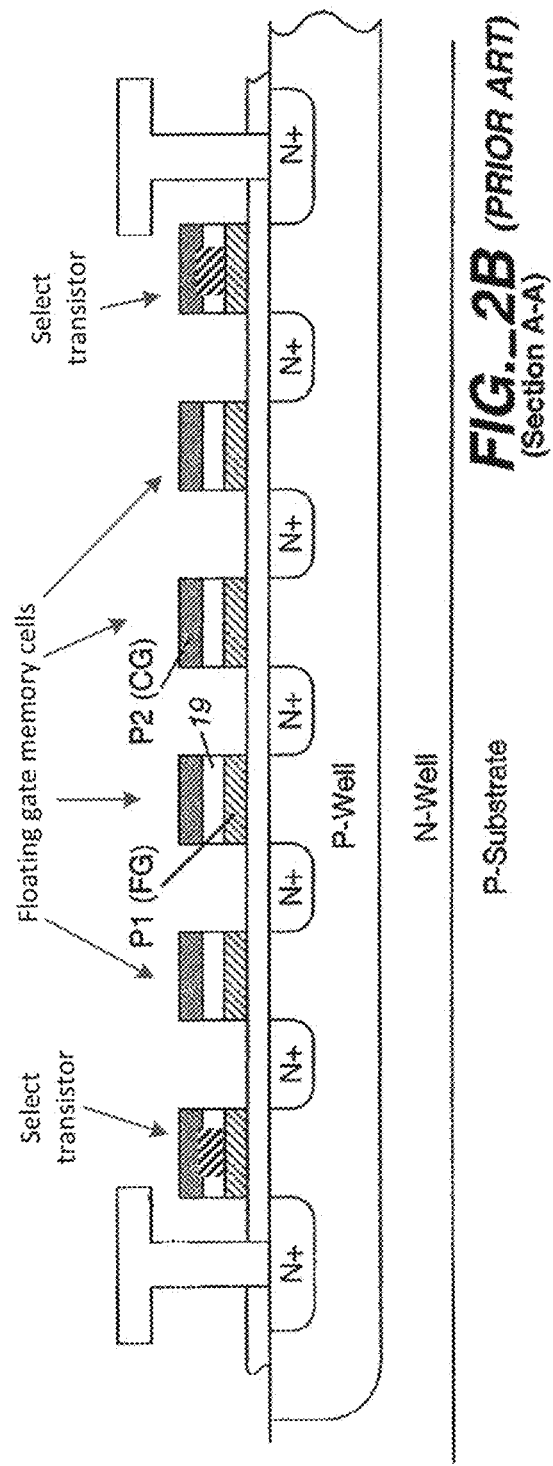
FIG._2B (Section A-A) *(PRIOR ART)*

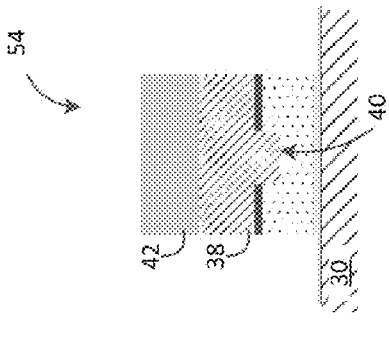
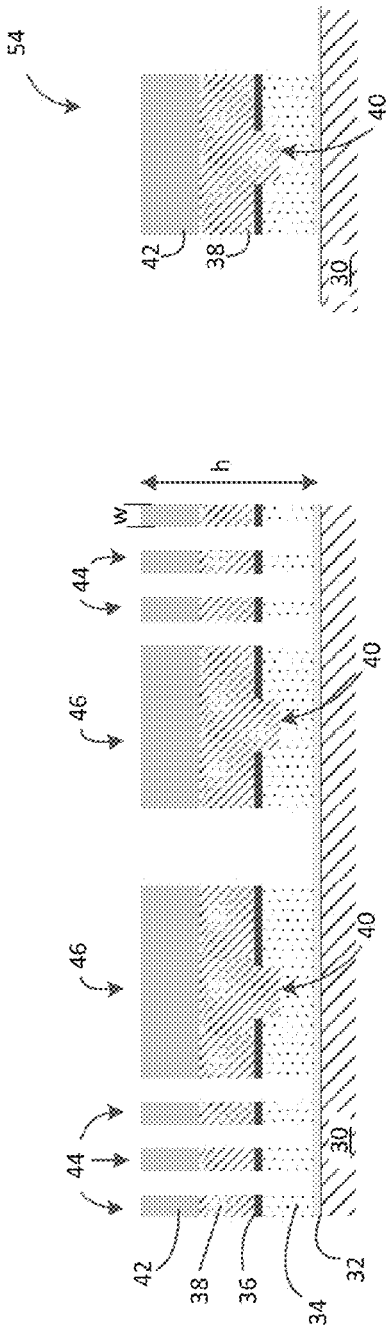
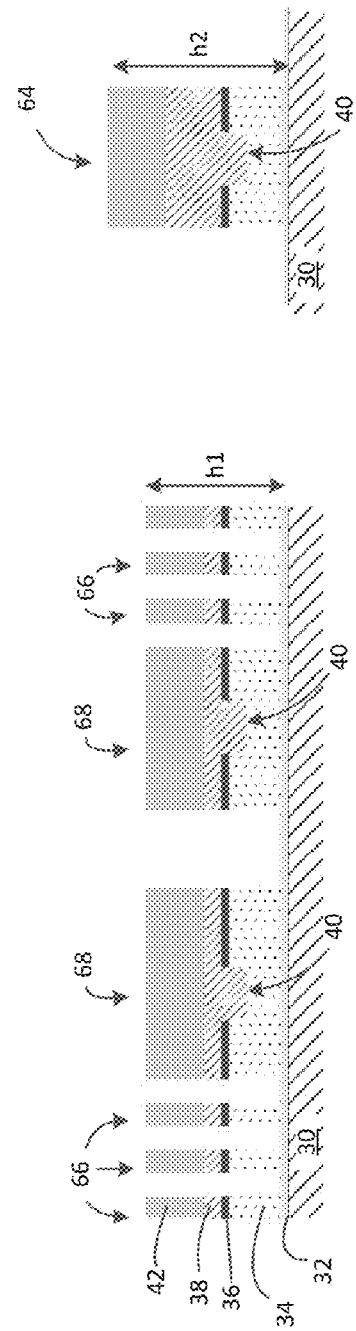

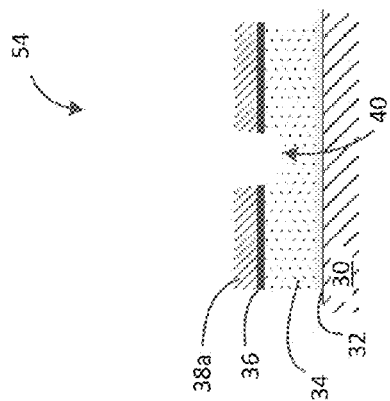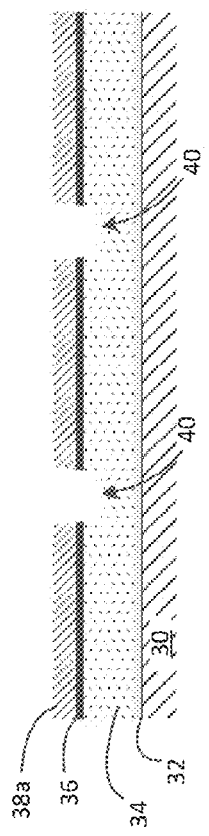
FIG. 5A    FIG. 5B
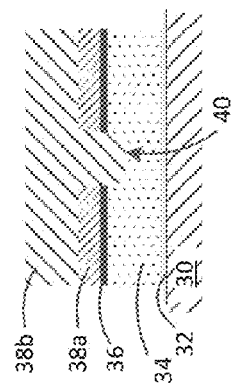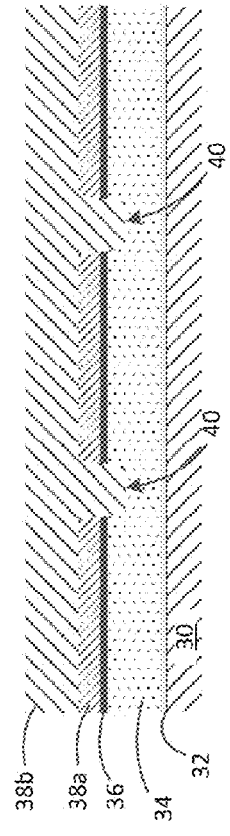
FIG. 6A    FIG. 6B

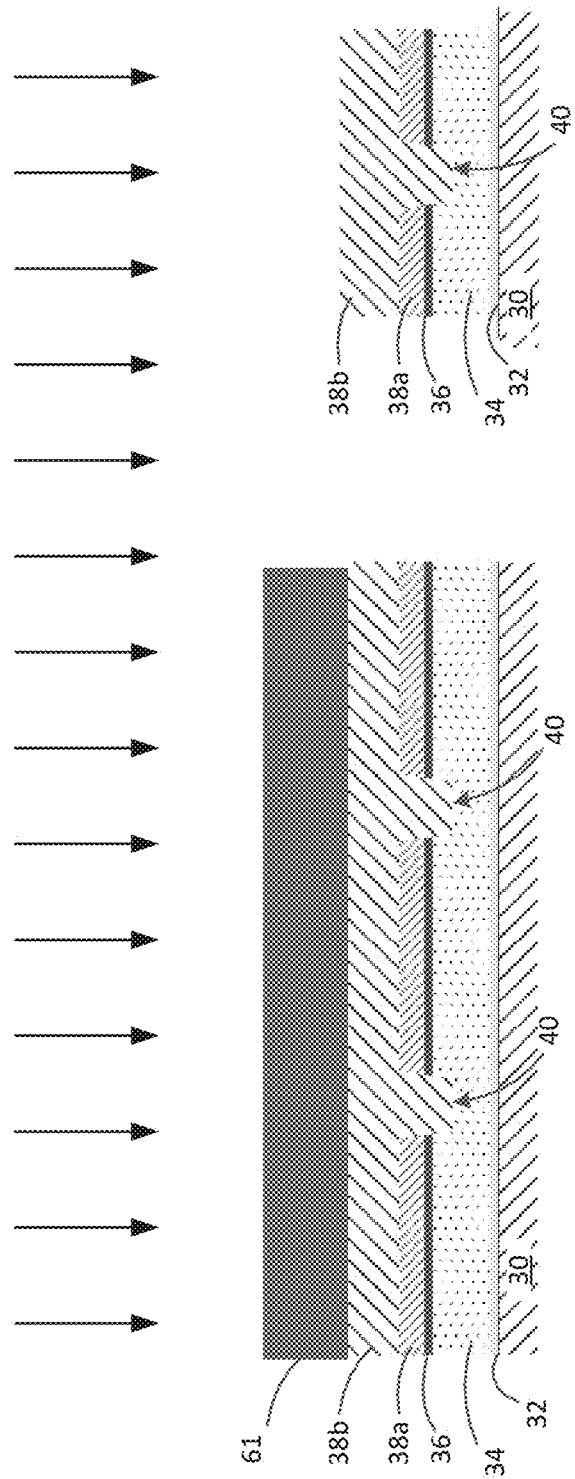

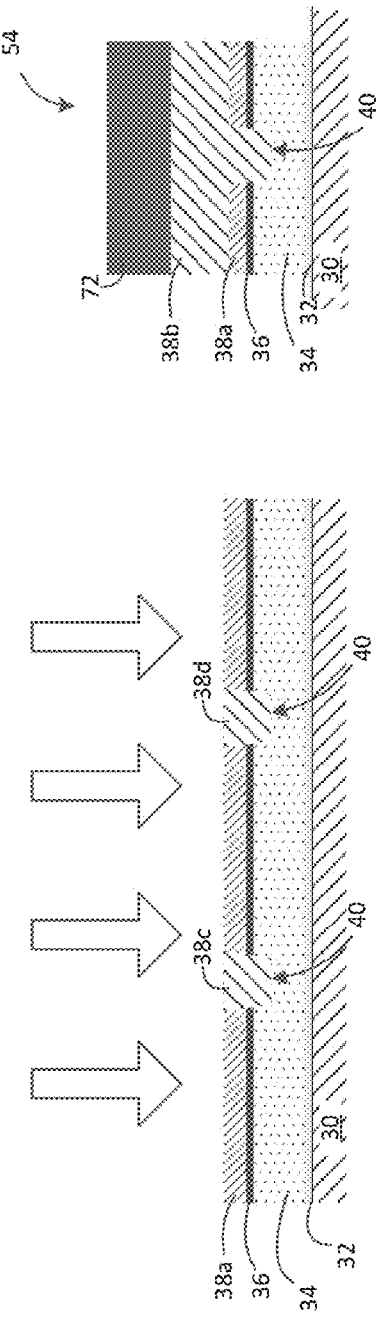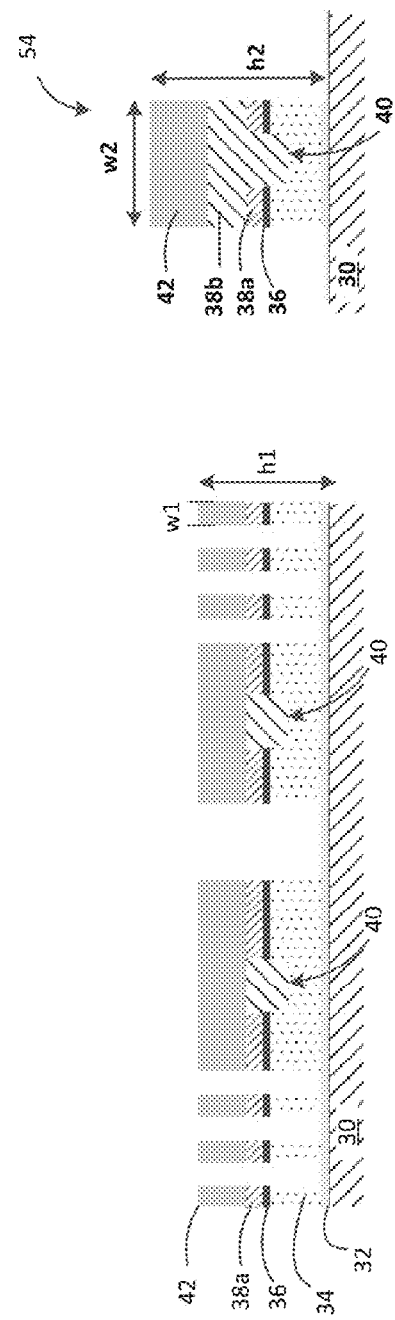

NAND FLASH MEMORY INTEGRATED CIRCUITS AND PROCESSES WITH CONTROLLED GATE HEIGHT

BACKGROUND OF THE INVENTION

This invention relates generally to non-volatile semiconductor memories of the flash EEPROM (Electrically Erasable and Programmable Read Only Memory) type, their formation, structure and use, and specifically to methods of making NAND memory integrated circuits.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, labeled P2 in FIG. 2B, a cross-section along line A-A of FIG. 2A). Control gate lines may also include an additional layer, or layers, such as a metal layer (not shown). Floating gates are also formed of polysilicon (polysilicon layer 1, labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

The top and bottom of the string connect to the bit line and a common source line respectively through select transistors (source select transistor and drain select transistor) in which the floating gate material (P1) is in direct contact with the control gate material (P2) through an opening formed in IPD material. The active gate thus formed is electrically driven from the periphery. Transistors in peripheral circuits are similarly formed by connecting floating gate material, P1, to overlying control gate material, P2, to form an active gate.

Select transistors and peripheral circuits are formed on the same chip as the memory cells but they have very different functions that require different device structures. Thus, a process that is adapted for forming a memory array may not be ideal for forming peripheral circuits and vice versa. In general, the cost of manufacturing a memory chip increases with the number of processing steps used, and the number of defective units may tend to increase also. So it is desirable to use the same process steps for both the memory array and peripheral circuits.

Thus, there is a need for a memory chip manufacturing process that forms the memory cells, select transistors, and peripheral circuits in an efficient manner and there is a need for structures that can be formed accordingly.

SUMMARY OF THE INVENTION

A series of steps may form floating gate transistors in an array area of a memory integrated circuit (IC) while forming peripheral transistors (without floating gates) in a peripheral area of the IC. The height of the floating gate transistors may be less than the height of the peripheral transistors. Thus, the aspect ratio of the floating gate transistors may be low enough to keep the risk of word line collapse low. Increased height in peripheral circuits provides lower resistance and thereby allows higher currents, and/or lower power consumption and heat generation. In a process flow in which control gates are formed of two polysilicon layers, an etch step after deposition of the second control gate polysilicon layer removes some or all of the second control gate polysilicon layer from the array area while leaving the second control gate polysilicon layer intact in the peripheral area.

An example of a method of forming a nonvolatile memory integrated circuit includes: depositing a first conductive layer across a cell area and across a peripheral area of a substrate; depositing a dielectric layer over the first conductive layer in the cell area and in the peripheral area of the substrate; depositing a second conductive layer over the dielectric layer in the cell area and in the peripheral area of the substrate; forming a plurality of openings in the second conductive layer and the dielectric layer in the peripheral area of the substrate; depositing a third conductive layer over the second conductive layer in the cell area and in the peripheral area of the substrate; subsequently masking the peripheral area of the substrate while leaving the cell area exposed; and subsequently removing material of the third conductive layer from the cell area while leaving the third conductive layer in place in the peripheral area.

Removing material of the third conductive layer from the cell area may remove less than all material of the third conductive layer from the cell area. The material of the third conductive layer may be removed from the cell area using an etch that also removes at least some material of the second conductive layer. The third conductive layer may be deposited directly on the first conductive layer in the plurality of openings. A plurality of peripheral transistors may be formed where the plurality of openings are located, a gate of a peripheral transistor formed by a portion of the first conductive layer, a portion of the second conductive layer, and a portion of the third conductive layer in electrical contact. The first conductive layer may be doped polysilicon, the dielectric layer may be an inter-poly dielectric layer, the second conductive layer may be doped polysilicon, and the third conductive layer may be doped polysilicon. Subsequent to removing material of the third conductive layer from the cell area, the peripheral area of the substrate may be unmasked; and a metal layer may be deposited in the cell area and in the peripheral area, the metal layer deposited on the second conductive layer in the cell area and deposited on the third conductive layer in the peripheral area. Subsequent to depositing the metal layer, the cell area may be patterned to form floating gates from the first conductive layer and to form control gates from the second conductive layer and the metal layer. Additional openings may be formed in the second conductive layer and the dielectric layer in the cell area and subsequently select transistors may be formed at locations of the additional openings.

An example of a nonvolatile memory integrated circuit includes: a plurality of floating gate memory cells on a substrate, each of the plurality of floating gate memory cells comprising: a floating gate formed from a first portion of a first conductive layer; a first portion of a dielectric layer overlying the floating gate; a control gate formed from a first portion of a second conductive layer in contact with the first portion of the dielectric layer and a first portion of a metal layer in contact with the first portion of the second conductive layer; and a plurality of peripheral transistors on the substrate, each of the plurality of peripheral transistors having a gate comprising: a second portion of the first conductive layer; a second portion of the second conductive layer in contact with the second portion of the first conductive layer; a portion of a third conductive layer in contact with the second portion of the second conductive layer; and a second portion of the metal layer in contact with the portion of the third conductive layer. The plurality of floating gate memory cells may, or may not contain any material of the third conductive layer. The second portion of the second conductive layer may lie in contact with the second portion of the first conductive layer in an area defined by an opening in the dielectric layer. The first, second, and third conductive layers may be formed of doped polysilicon. The metal layer may be formed of Tungsten. A plurality of select transistors may be connected in series with a string of floating gate memory cells, each of the plurality of select transistors having a gate comprising: a third portion of the first conductive layer; a third portion of the second conductive layer in contact with the third portion of the first conductive layer; and a third portion of the metal layer in contact with the third portion of the second conductive layer.

An example of a method of forming a nonvolatile memory integrated circuit includes: depositing a gate dielectric layer across a cell area and across a peripheral area of a substrate; depositing a floating gate layer over the gate dielectric layer in the cell area and in the peripheral area of the substrate; depositing an inter-poly dielectric layer over the floating gate layer in the cell area and in the peripheral area of the substrate; depositing a first control gate polysilicon layer over the inter-poly dielectric layer in the cell area and in the peripheral area of the substrate; forming a plurality of openings in the first control gate polysilicon layer and the inter-poly dielectric layer in the peripheral area of the substrate; depositing a second control gate polysilicon layer over the first control gate polysilicon layer in the cell area and in the peripheral area of the substrate so that the second control gate polysilicon layer contacts the floating gate layer in the plurality of openings; subsequently removing material of the second control gate polysilicon layer from the cell area while leaving the second control gate polysilicon layer intact in the peripheral area; and subsequently depositing a metal control gate layer in the cell area and in the peripheral area of the substrate.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.
FIG. 2A is a plan view of a prior art NAND array.
FIG. 2B is a cross-sectional view of the prior art NAND array of FIG. 2A taken along the line A-A.
FIG. 3A is a cross-sectional view of a prior art NAND array.
FIG. 3B is a cross-sectional view of a prior art peripheral transistor.
FIG. 4A is a cross-sectional view of a NAND array with reduced height compared with peripheral transistors.
FIG. 4B is a cross-sectional view of a peripheral transistor that is higher than transistors of the NAND array.
FIGS. 5A and 5B are cross-sectional views of a NAND array and a peripheral transistor respectively at an intermediate stage of fabrication.
FIGS. 6A-6D are cross-sectional views of the NAND array and peripheral transistor of FIGS. 5A and 5B at a later stage of fabrication.
FIGS. 7A and 7B are cross-sectional views of the NAND array and peripheral transistor of FIGS. 6A and 6B at a later stage of fabrication.
FIGS. 8A and 8B are cross-sectional views of the NAND array and peripheral transistor of FIGS. 5A and 5B at a later stage of fabrication.

DETAILED DESCRIPTION OF EXEMPLARY EMBODIMENTS

Memory System

Figure 9:
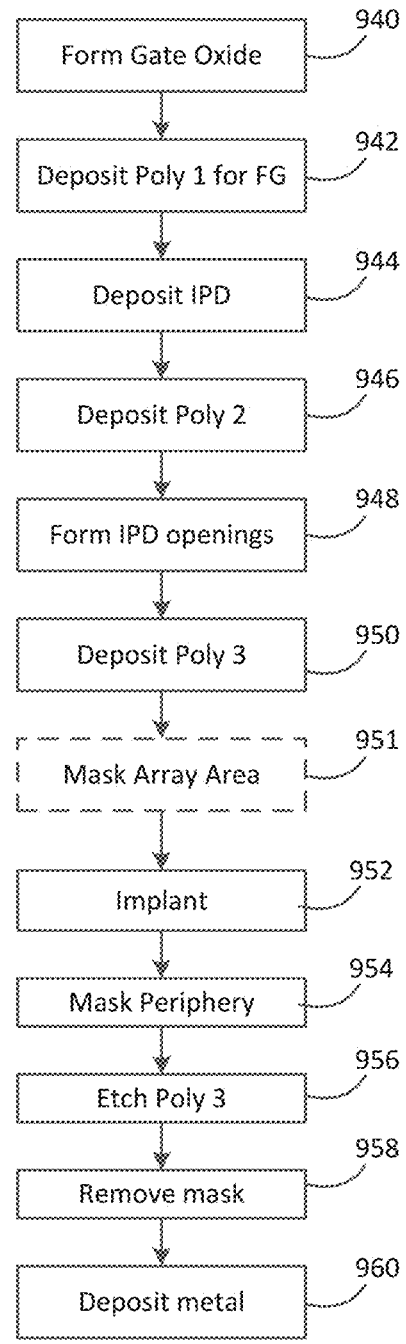
FIG. 9 illustrates a series of steps in manufacturing a NAND flash memory chip.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

A typical prior art NAND array such as shown in FIGS. 2A-B includes control gate (word) lines extending across multiple strings over rows of floating gates with a suitable insulating dielectric layer in between. One control gate (word) line is used for each row of floating gates. In order to make an array with the floating and control gates self-aligned in a y-direction (along the lengths of the NAND strings), the same mask is generally used to form the control gates and to form the floating gates, which then have the same dimensions in the y-direction as the control gates. A single etch step may be used to form such control gate/floating gate stacks and to also define select gates.

FIG. 3A shows a cross section of a portion of a NAND flash memory array at an intermediate stage of fabrication showing the layers of materials (after patterning to form separate memory cells and select transistors) according to an example. The cross-section of FIG. 3A corresponds to FIG. 2A (i.e. cross section along NAND string, A-A in FIG. 2A). A gate dielectric (tunnel dielectric) layer 32 extends along the surface of substrate 30. The gate dielectric layer 32 may be formed of Silicon Dioxide ("oxide") or other suitable dielectric material. A first layer of conductive material 34 overlies gate dielectric layer 32 and is patterned into separate floating gates of memory cells. The first conductive layer 34 may be formed from doped polysilicon. A dielectric layer 36 overlies first conductive layer 34. A second conductive layer 38 overlies the dielectric layer 36. The second conductive layer may be formed of doped polysilicon and may be deposited in two deposition steps. The dielectric layer may be referred to as Inter Poly Dielectric (IPD) because it is located between polysilicon layers 34 and 38. Openings 40 in dielectric layer 36 allow contact between the first and second polysilicon layers in certain locations. A layer of metal 42 overlies the second polysilicon layer 38. A suitable metal may be Tungsten, with a suitable barrier layer (e.g. Tungsten Nitride or similar layer). The cross-section of FIG. 3A shows the structure after patterning (e.g. after forming a layer of resist, performing photolithographic patterning of the resist, and performing anisotropic etching such as RIE) to form separate memory cells 44 which each include a floating gate and a control gate. An individual control gate is formed of a portion of second conductive layer 38 and metal layer 42 where they overlie a floating gate formed by a portion of conductive layer 34. The control gate is electrically isolated from the floating gate by a portion of dielectric layer 36 which thus permits some capacitive coupling while preventing current flow between these elements.

In contrast to floating gate memory cells 44, select transistors 46 do not include floating gates. Openings 40 provide electrical contact between floating gate polysilicon layer 34 and control gate polysilicon layer 38 so that a single electrically continuous body is formed that acts as an active gate of the select transistor.

FIG. 3B shows a peripheral transistor 54 on the same substrate 30 as shown in FIG. 3A. The peripheral transistor 54 is similar to the select transistor 46 in that it includes an opening 40 between the floating gate polysilicon layer 34 and the control gate polysilicon layer 38 and thus has a single active gate rather than a floating gate and separate control gate as in memory cell 44. While the cross-section looks similar, it will be understood that the dimensions may be different based on different requirements of peripheral transistors and that the dimensions shown are not intended to be to scale. For example, peripheral transistors may be larger than select transistors in order to accommodate higher current. The lateral dimensions of peripheral transistors and the sizes of features such as openings 40 in such transistors may be significantly larger than those of select transistors (which may be larger than memory cells). In general, some peripheral circuits are required to handle large currents (compared to currents in the cell area) and reducing electrical resistance in such circuits is important to reduce power consumption and heat generation. For example, in order to reduce series resistance of connections to peripheral transistors such as transistor 54, it is generally desirable to provide a low resistance connection by choosing suitable dimensions for control gate layers 38 and 42. Increasing the thickness of control gate layers may provide a larger cross-sectional area for lateral current flow and thereby reduce resistance of a given connection.

In a memory array such as shown in FIG. 3A with high aspect ratios, word line collapse is a concern. The aspect ratio may be defined as the vertical dimension of a structure (e.g. floating gate memory cell) divided by its lateral dimension. In FIG. 3A the aspect ratio of floating gate transistors is h/w1. Tall, narrow structures have higher aspect ratios while short, wide structures have lower aspect ratios. It can be seen that memory cell structures that include a stack formed of floating gate and control gate layers may have high aspect ratios and are therefore vulnerable to collapse. For example, such structures may be deformed by etching or cleaning processes so that they come in contact with neighboring structures and thus cause word line-to-word line shorting. In contrast, wider structures such as peripheral transistor 54 have lower aspect ratios.

According to an aspect of the present invention, a nonvolatile memory integrated circuit is formed with low resistance connections to transistors of peripheral transistors and with acceptable aspect ratios in a memory cell array, using process steps that are generally common to the array area and the peripheral area.

FIGS. 4A and 4B show the cell area and peripheral area of a NAND flash memory integrated circuit in cross-sectional view corresponding to those of FIGS. 3A and 3B. It can be seen that peripheral transistor 64 has a height (h2) that is greater than the height (h1) of memory cells 66 and select gates 68. In particular, second conductive layer 38 is thicker in the peripheral area than in the cell area. This provides a relatively low resistance connection to peripheral transistor 64 while maintaining memory cell aspect ratio within acceptable limits. While two different heights are achieved the process steps used to form the structures are largely common to both the cell area and the peripheral area so that processing cost and complexity is relatively low.

An example of process steps used to fabricate structures shown in FIGS. 4A and 4B will now be described. It will be understood that this is for illustration and that other processes and variations may be used to fabricate similar structures. For example, different materials may be used for some structures and dimensions may be different than shown (dimensions are not intended to be to scale).

FIGS. 5A and 5B show the cell area and peripheral area respectively at an earlier stage of fabrication than previously shown in FIGS. 4A and 4B. A stack of layers has been formed at this stage, including gate dielectric layer 32, floating gate layer 34, IPD layer 36, and a first control gate polysilicon layer 38a. These layers may be deposited as blanket layers with each layer deposited directly on the prior layer. Openings 40 are shown at locations in the cell area where select transistors are to be formed, and at locations in the peripheral area where peripheral transistors are to be formed.

FIGS. 6A and 6B show the structures of FIGS. 5A and 5B after deposition of a second control gate polysilicon layer 38b. Second control gate polysilicon layer 38b overlies first control gate polysilicon layer 38a. In openings 40, second control gate polysilicon layer 38b lies in contact with floating gate polysilicon layer 34. Thus, electrical contact is made between second control gate polysilicon layer 38b and floating gate layer 34 in openings 40. At this stage, the stack of layers is the same in the cell area and in the peripheral area. Implantation may be performed at this stage in order to modify control gate polysilicon and make it conductive, or change its properties.

It will be understood that different schemes may be used to achieve different doping of polysilicon according to device design. Polysilicon may be doped as deposited (e.g. in a CVD process that introduces dopant during deposition). Alternatively, polysilicon may be undoped when it is deposited and may later have dopant added (e.g. by implantation or diffusion) to modify properties of the polysilicon. FIGS. 6B and 6C show one example of a scheme for selectively doping second control gate polysilicon layer 38b. In this scheme, a resist portion 61 covers the array area of FIG. 6C thus preventing implantation of dopant (e.g. Phosphorous) in the array area. Meanwhile, the peripheral area shown in FIG. 6D is exposed (no resist covering) so that second control gate polysilicon layer 38b in the peripheral area is implanted to an appropriate dopant concentration. Subsequently, resist portion 61 is removed.

FIGS. 7A and 7B show the structures of FIGS. 6A and 6B after patterning and etching. A masking portion 72 overlies the peripheral area while the cell area is exposed. The masking portion may be formed of resist and may be patterned by photolithography so that resist is removed from the cell area but remains in the peripheral area. An etch may then be performed while the resist masks the peripheral area and while the cell area is exposed. This etch process removes exposed material of the second control gate polysilicon layer 38b. Depending on the desired height in the cell area, the etch process may remove the entire second control gate polysilicon layer overlying the first control gate polysilicon, or some fraction of the second control gate polysilicon (leaving some remaining fraction on the first control gate polysilicon). Some of the second control gate polysilicon layer 38b remains in openings 40 as shown by portions 38c and 38d of FIG. 7A. Where a selective implantation scheme as shown in FIGS. 6C and 6D is used, portions 38c and 38d may be undoped because they were masked by resist 61 during dopant implantation. In contrast, second control gate polysilicon layer 38b in the peripheral area of FIG. 7B is doped. In some cases, etching may remove some of the first control gate polysilicon layer 38a. The etch may be a timed etch that continues through control gate polysilicon layers 38a and 38b for a predetermined period of time to achieve a desired height. The depth of this etch determines a height difference between cell area structures and peripheral area structures and may be selected according to requirements (e.g. according to resistance desired in the peripheral area and aspect ratio limits in the cell area).

FIGS. 8A and 8B show the structures of FIGS. 7A and 7B after unmasking of the peripheral area by removal of the masking portion, subsequent deposition of control gate metal and subsequent patterning. Resist used as the masking portion may be removed by ashing or otherwise so that the second control gate polysilicon layer 38b is exposed in the peripheral area. In the cell area where material of the second control gate polysilicon layer 38b was removed, the first control gate polysilicon layer 38a may be exposed. Control gate metal layer 42 is then deposited across both the cell area and the peripheral area. Thus, control gates in the cell area in this example are formed from a portion of first control gate polysilicon layer 38a in direct contact with a portion of control gate metal layer 42 (with no intervening second control gate polysilicon). Gates in the peripheral area additionally include a portion of second control gate polysilicon layer 38b between first control gate polysilicon layer 38a and control gate metal layer 42. This extra layer in the peripheral area produces a height difference between lower structures in the array area and higher structures in the peripheral area.

The height difference between the array area (h1) and the peripheral area (h2) in this example is simply the thickness of the second control gate polysilicon layer 38b. It will be understood that this height difference is determined by the etch used to remove material of the second control gate polysilicon layer 38b which may leave some of the second control gate polysilicon layer 38b in place, or may continue to etch into first control gate polysilicon layer 38a, and does not necessarily stop at the boundary between first control gate polysilicon layer 38a and second control gate polysilicon layer 38b. Thus, the height difference may be greater than, or less than, the thickness of second control gate polysilicon layer 38b.

Such a height difference is advantageous because it allows the height of structures in the peripheral area to be increased without increasing the risk of word line collapse in the array area. Thus, for a given geometry (minimum feature size) in the array area there may be some height limit, $h_{max}$, beyond which the risk of word line collapse becomes unacceptable. Therefore, h1 may be maintained below this limit (h1<$h_{max}$). This limit may be exceeded in the peripheral area (h2>$h_{max}$). Increasing the height of a conductive layer (or stack of layers) reduces the sheet resistance of the layer and reduces the resistance of conductive lines formed from such a layer. Conductive lines connecting peripheral transistors may be higher and thus may have lower resistance. This may permit higher current for a given line width and/or may provide less power consumption and heat generation for a given current.

It will be understood that aspects of the present invention may be implemented by adding relatively few steps to current process flows so that the cost and complexity is low in comparison with the benefits.

FIG. 9 shows an example of a process flow for producing integrated circuits with a height difference between an array area and a peripheral area. A gate oxide (gate dielectric) is formed 940 on the surface of a silicon wafer. Subsequently, a first polysilicon layer is deposited 942 on the gate oxide to form a floating gate layer ("FG"). A dielectric layer ("Inter Poly Dielectric layer" or "IPD") is formed 944 on the floating gate layer. A second polysilicon layer "Poly 2" (first control gate polysilicon) is then deposited 946 on the IPD layer. Patterning and etching is performed at this point to form openings 948 that extend through the Poly 2 layer and the IPD layer. Subsequently, a third polysilicon layer "Poly 3" is deposited 950 to fill the openings and allow electrical contact with portions of the FG layer where floating gates are not desired (i.e. where a conventional transistor rather than a floating gate transistor is to be formed, which may be for a select transistor, or peripheral transistor). The array area is masked in step 951 to allow selective implantation of the third polysilicon layer in the peripheral area only. An implant step 952 allows the electrical properties of the polysilicon layers to be adjusted according to requirements. Subsequently, the peripheral area is masked 954 using a pattern of photoresist portions that cover the periphery while leaving the array area exposed. Subsequently, material of the Poly 3 layer is etched 956 in the array area (while the peripheral area is masked so that the Poly 3 layer there remains intact). Substantially all Poly 3 material may be removed in the array area where it overlies the Poly 2 layer (some Poly 3 may remain in openings). In some cases, some Poly 3 material may remain over the Poly 2 layer. In some cases, etching removes some Poly 2 material in addition to Poly 3 (i.e. etching continues past the interface between Poly 3 and Poly 2). After etching, the photoresist mask is removed 958 so that processing can continue on both the array and peripheral areas together. A metal layer (e.g. tungsten with a tungsten nitride barrier layer) is deposited 960 across both the array area and the peripheral area. Subsequently, patterning and etching are performed to form individual floating gate transistors of memory cells and select transistors in the array area and form peripheral transistors in the peripheral area.

Figure 10A:
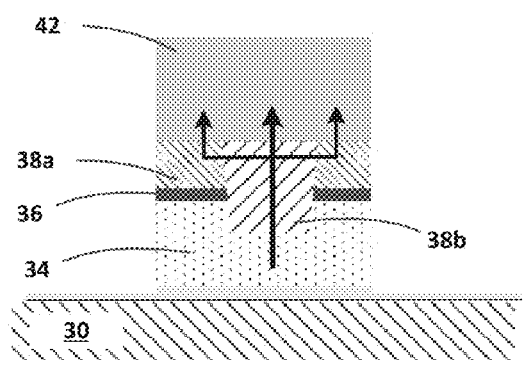
FIGS. 10A and 10B illustrate current flow through transistors with different layers.
Figure 10B:
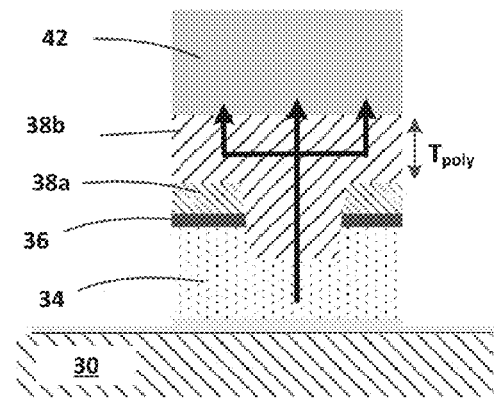

Transistors formed according to examples described above may have various dimensions and materials which may affect current flow. FIGS. 10A and 10B illustrate particular examples in which first control gate polysilicon layer 38*a* and second control gate polysilicon layer 38*b* have different doping which affects electrical current flow in the transistors formed. In this example first control gate polysilicon layer 38*a* is formed of P+ polysilicon, which may be doped using an appropriate P dopant such as boron (B) while second control gate polysilicon layer 38*b* is formed of N+ polysilicon, which may be doped using an appropriate N dopant such as Phosphorous (P). The different types of dopant result in a P-N junction along the interface between layers 38*a* and 38*b* which may affect current flow.

For example, FIG. 10A shows a transistor with a low gate (such as a select transistor) that does not have second control gate polysilicon layer 38*b* extending over first control gate polysilicon layer 38*a* (second control gate polysilicon layer portion 38*c* remains only where openings were formed and is removed from over first control gate polysilicon layer 38*a* and may be undoped). In this case, electrical current (shown by heavy lines extending from floating gate polysilicon layer 34 to control gate metal 42) flows through second control gate polysilicon layer portion 38*c* (undoped or N+ polysilicon) and also flows laterally through the interface with first control gate polysilicon layer 38*a* and then up to control gate metal layer 42. Such a transistor may have relatively high contact resistance along interfaces between first and second control gate polysilicon layers 38*a* and 38*b*, and also between first control gate polysilicon layer 38*a* (P+ polysilicon) and control gate metal layer 42. For example, where the metal layer includes tungsten with a tungsten nitride barrier there is a relatively high contact resistance along the metal-to-P+ polysilicon interface (work function of about 5.1 eV).

In contrast to FIG. 10A, the transistor of FIG. 10B has second control gate polysilicon layer 38*b* extending over first control gate polysilicon layer 38*a*. In this example, second control gate polysilicon layer 38*b* is N+ doped with Phosphorous so that it has a work function that is close to that of control gate metal layer 42 and so provides low contact resistance along the interface between these layers (work function of approximately 4.1 eV). Such a low contact resistance allows electrical current to flow easily from floating gate polysilicon layer 34 through second control gate polysilicon layer 38*b* to control gate metal layer 42 without passing through first control gate polysilicon layer 38*a* and without passing through the P-N junction formed along the interface between first and second control gate polysilicon layers 38*a* and 38*b*. While FIG. 10A shows a small area of second control gate polysilicon layer 38*b* in direct contact with control gate metal layer 42, FIG. 10B shows a much larger area in direct contact which provides lower resistance.

Direct contact between oppositely doped polysilicon layers 38*a* and 38*b* may cause some interaction between the materials in these layers. For example, dopants may diffuse between layers thus forming depleted areas near the interface. In order to ensure an adequate doping level in second control gate polysilicon layer 38*b* along its interface with control gate metal layer 42, second control gate polysilicon layer 38*b* may be formed of sufficient thickness to allow for some diffusion (i.e. some loss of phosphorous and some diffusion of boron into second control gate polysilicon layer 38*b*). FIG. 10B shows the thickness of second control gate polysilicon layer 38*b* as Tpoly, which may be of sufficient thickness to ensure phosphorous concentration remains high (N+) along the interface with control gate metal layer 42, which provides a low contact resistance at this interface. The minimum value of Tpoly may depend on the initial doping levels in first and second control gate polysilicon layers 38*a* and 38*b* and subsequent diffusion caused by heat (e.g. during subsequent processing).

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

The invention claimed is:

1. A method of forming a nonvolatile memory integrated circuit comprising:
   depositing a floating gate layer of doped polysilicon across a cell area and across a peripheral area of a substrate;
   depositing an inter-poly dielectric layer over the floating gate layer in the cell area and in the peripheral area of the substrate;
   depositing a P+ doped polysilicon layer over the inter-poly dielectric layer in the cell area and in the peripheral area of the substrate;
   forming a plurality of openings in the P+ doped polysilicon layer and the inter-poly dielectric layer in the peripheral area of the substrate;
   depositing an N+ doped polysilicon layer over the P+ doped polysilicon layer in the cell area and in the peripheral area of the substrate, the N+ doped polysilicon layer deposited to at least a minimum thickness over the P+ doped polysilicon layer that is sufficient to maintain N+ doping at an upper surface of the N+ doped polysilicon layer;
   subsequently masking the peripheral area of the substrate while leaving the cell area exposed;

subsequently removing material of the N+ doped polysilicon layer from the cell area while leaving the N+ doped polysilicon layer in place in the peripheral area; and subsequently depositing a metal layer over the P+ doped polysilicon layer in the cell area and over the upper surface of the N+ doped polysilicon layer in the peripheral area, a first contact resistance between the metal layer and the upper surface of the N+ doped polysilicon layer being less than a second contact resistance along an interface between the P+ doped polysilicon layer and the metal layer in the cell area.

2. The method of claim 1 wherein the removing material of the N+ doped polysilicon layer from the cell area removes less than all material of the N+ doped polysilicon layer from the cell area.

3. The method of claim 1 wherein the material of the N+ doped polysilicon layer is removed from the cell area using an etch that also removes at least some material of the P+ doped polysilicon layer.

4. The method of claim 1 wherein the N+ doped polysilicon layer is deposited directly on the floating gate layer in the plurality of openings.

5. The method of claim 4 further comprising forming a plurality of peripheral transistors where the plurality of openings are located, a gate of a peripheral transistor formed thru a portion of the floating gate layer, a portion of the P+ doped polysilicon layer, and a portion of the N+ doped polysilicon layer in electrical contact.

6. The method of claim 1 further comprising:
subsequent to removing material of the N+ doped polysilicon layer from the cell area, unmasking the peripheral area of the substrate
prior to depositing the metal layer in the cell area and in the peripheral area.

7. The method of claim 6 further comprising:
subsequent to depositing the metal layer, patterning the cell area to form floating gates from the floating gate layer and to form control gates from the P+ doped polysilicon layer and the metal layer.

8. The method of claim 1 further comprising forming additional openings in the P+ doped polysilicon layer and the inter-poly dielectric layer in the cell area and subsequently forming select transistors at locations of the additional openings.

9. A method of forming a nonvolatile memory integrated circuit comprising:
depositing a gate dielectric layer across a cell area and across a peripheral area of a substrate;
depositing a floating gate layer over the gate dielectric layer in the cell area and in the peripheral area of the substrate;
depositing an inter-poly dielectric layer over the floating gate layer in the cell area and in the peripheral area of the substrate;
depositing a first control gate polysilicon layer over the inter-poly dielectric layer in the cell area and in the peripheral area of the substrate;
forming a plurality of openings in the first control gate polysilicon layer and the inter-poly dielectric layer in the peripheral area of the substrate;
depositing a second control gate polysilicon layer over the first control gate polysilicon layer in the cell area and in the peripheral area of the substrate so that the second control gate polysilicon layer contacts the floating gate layer in the plurality of openings;
subsequently removing material of the second control gate polysilicon layer from the cell area while leaving the second control gate polysilicon layer intact in the peripheral area; and
subsequently depositing a metal control gate layer in the cell area and in the peripheral area of the substrate.

10. The method of claim 9 wherein the first control gate polysilicon layer is formed of P+ doped polysilicon and the second control gate polysilicon layer is deposited as undoped polysilicon and is subsequently selectively implanted with N-type dopant in only the peripheral area.

* * * * *